(12) United States Patent
Miao et al.

(10) Patent No.: US 9,767,900 B2
(45) Date of Patent: Sep. 19, 2017

(54) METHOD, APPARATUS AND DEVICE FOR OPERATING LOGICAL OPERATION ARRAY OF RESISTIVE RANDOM ACCESS MEMORY

(71) Applicant: Huawei Technologies Co., Ltd., Shenzhen (CN)

(72) Inventors: Xiangshui Miao, Wuhan (CN); Yi Li, Wuhan (CN); Yaxiong Zhou, Wuhan (CN); Ronggang Xu, Shenzhen (CN); Junfeng Zhao, Shenzhen (CN); Zhulin Wei, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/266,367

(22) Filed: Sep. 15, 2016

(65) Prior Publication Data
US 2017/0004880 A1 Jan. 5, 2017

Related U.S. Application Data

(63) Continuation of application No. PCT/CN2014/073620, filed on Mar. 18, 2014.

(51) Int. Cl.
*G11C 11/00* (2006.01)
*G11C 13/00* (2006.01)
*H01L 27/24* (2006.01)

(52) U.S. Cl.
CPC .......... *G11C 13/004* (2013.01); *G11C 13/003* (2013.01); *G11C 13/0007* (2013.01); *G11C 13/0059* (2013.01); *G11C 13/0069* (2013.01); *H01L 27/2436* (2013.01); *H01L 27/2463* (2013.01); *G11C 13/0002* (2013.01); *G11C 2213/78* (2013.01); *G11C 2213/79* (2013.01)

(58) Field of Classification Search
CPC ............ G11C 13/0069; G11C 13/0004; G11C 13/0007
USPC ............................... 365/148, 189.04, 189.08
See application file for complete search history.

(56) References Cited

U.S. PATENT DOCUMENTS 7,057,919 B1 * 6/2006 Jenne ....................... G11C 11/16
365/158
8,059,438 B2 11/2011 Chang et al.
(Continued)

FOREIGN PATENT DOCUMENTS

CN 102099862 A 6/2011
CN 102412827 A 4/2012
(Continued)

OTHER PUBLICATIONS

Machine Translation and Abstract of Chinese Publication No. CN102811051, Dec. 5, 2012, 4 pages.
(Continued)

*Primary Examiner* — Connie Yoha
(74) *Attorney, Agent, or Firm* — Conley Rose, P.C.

(57) ABSTRACT

A logical operation array of a resistive random access memory includes at least one logical operation unit; each logical operation unit includes multiple resistive random access memories, multiple field effect transistor switches and a voltage converter. The logical operation array is set for performing logical operation and enable to storage output level signal in one resistive random access memory after the logical operation

11 Claims, 5 Drawing Sheets

Turn on a first field effect transistor switch of at least one group of logical operation units in a logical operation array, turn off a second field effect transistor switch of the logical operation unit, and set a third resistive random access memory of the logical operation unit to a storage bit write voltage; and separately input a level signal to input ends of a first resistive random access memory and a second resistive random access memory of the logical operation unit — 101

After a logical operation, turn off the first field effect transistor switch, turn on the second field effect transistor switch, set the third resistive random access memory to a read voltage, and output a level signal that is stored in the third resistive random access memory after the logical operation — 102

(56) References Cited

U.S. PATENT DOCUMENTS

| | | | |
|---|---|---|---|
| 8,269,203 | B2 | 9/2012 | Greene et al. |
| 8,427,203 | B2 | 4/2013 | Pino et al. |
| 8,431,918 | B2 | 4/2013 | Wirtz et al. |
| 2009/0296446 | A1* | 12/2009 | Asao ................ G11O 5/063 365/63 |
| 2011/0051482 | A1 | 3/2011 | Chang et al. |
| 2014/0028347 | A1 | 1/2014 | Robinett et al. |
| 2017/0004867 | A1* | 1/2017 | Roy .................. G11C 11/1673 |
| 2017/0040982 | A1* | 2/2017 | Miao ................ G11C 13/0002 |

FOREIGN PATENT DOCUMENTS

| | | | |
|---|---|---|---|
| CN | 102811051 | A | 12/2012 |
| CN | 102820055 | A | 12/2012 |
| CN | 102882514 | A | 1/2013 |

OTHER PUBLICATIONS

Machine Translation and Abstract of Chinese Publication No. CN102882514, Jan. 16, 2013, 5 pages.

Kvatinsky, S., et al., "MRL—Memristor Ratioed Logic," 2012, 6 pages.

Foreign Communication From A Counterpart Application, PCT Application No. PCT/CN2014/073620, English Translation of International Search Report dated Nov. 26, 2014, 2 pages.

Foreign Communication From A Counterpart Application, PCT Application No. PCT/CN2014/073620, English Translation of Written Opinion dated Nov. 26, 2014, 6 pages.

Zhang, N., et al., "An Efficient Design and Implementation of and Operation in Stateful Logic Based on Memristor" Journal of Computer Research and Development, Jan. 4, 2012, 7 pages.

Foreign Communication From A Counterpart Application, Chinese Application No. 201480000751.1, Chinese Office Action dated Jul. 4, 2017, 5 pages.

* cited by examiner

METHOD, APPARATUS AND DEVICE FOR OPERATING LOGICAL OPERATION ARRAY OF RESISTIVE RANDOM ACCESS MEMORY

CROSS-REFERENCE TO RELATED APPLICATIONS

This application is a continuation of International Application No. PCT/CN2014/073620, filed on Mar. 18, 2014, which is hereby incorporated by reference in its entirety.

TECHNICAL FIELD

Embodiments of the present disclosure relate to the field of electronic technologies, and in particular, to a method, an apparatus, and a device for operating a logical operation array of a resistive random access memory.

BACKGROUND

A conventional computer uses the Von Neumann architecture, and in the architecture, computation and storage are separated, and are respectively completed by a central processing unit (CPU) and a memory. With development of science and technology, speeds and capacities of the CPU and the memory are rapidly increased; however, improvement of a speed of a bus used for transmitting data is limited, which results in a transmission bottleneck called a Von Neumann bottleneck, that is, a memory wall. Therefore, it is expected that computation and storage can be completed in a same component or circuit, so as to implement integration of information storage and computation and increase a speed and efficiency. A resistive random access memory (RRAM) serves as a next-generation non-volatile memory with high potential, and can implement reversible conversion between high resistance and low resistance under the action of an electrical impulse, and a high resistance state and a low resistance state are used to store "0" and "1".

In the prior art (Chinese Patent Application Publication 102882514 A), an AND logic circuit is extended to become a computational array. A basic circuit implements a logical operation by introducing an auxiliary input section and a comparator. However, an operation method for implementing computation is relatively complex, and a computation result still needs to be output to a dedicated external memory for storage.

SUMMARY

Embodiments of the present disclosure provide a method, an apparatus, and a device for operating a logical operation array of a resistive random access memory, so as to resolve a problem in the prior art that the resistive random access memory is used only to perform an operation and an operation result needs to be output to an external memory for storage.

According to a first aspect, an embodiment of the present disclosure provides a method for operating a logical operation array of a resistive random access memory, including turning on a first field effect transistor switch of at least one logical operation unit in the logical operation array, turning off a second field effect transistor switch of the logical operation unit, and setting a third resistive random access memory of the logical operation unit to a storage bit write voltage; and separately inputting a level signal to input ends of a first resistive random access memory and a second resistive random access memory of the logical operation unit; where the logical operation array includes at least one logical operation unit, where each logical operation unit includes the first resistive random access memory, the second resistive random access memory, the third resistive random access memory, the first field effect transistor switch, the second field effect transistor switch, and a voltage converter; an input end of the first resistive random access memory serves as a first bit line input end; an input end of the second resistive random access memory serves as a second bit line input end; and an output end of the first resistive random access memory is connected to an output end of the second resistive random access memory, and is connected to an input end of the voltage converter; a gate electrode input end of the first field effect transistor switch serves as a first word line input end; a gate electrode input end of the second field effect transistor switch serves as a second word line input end; an output end of the voltage converter is connected to a drain electrode of the first field effect transistor switch, and a source electrode of the first field effect transistor switch is connected to an input end of the third resistive random access memory; and the input end of the third resistive random access memory is further connected to a drain electrode of the second field effect transistor switch, and a source electrode of the second field effect transistor switch is grounded; and after a logical operation, turning off the first field effect transistor switch, turning on the second field effect transistor switch, setting the third resistive random access memory to a read voltage, and outputting a level signal that is stored in the third resistive random access memory after the logical operation.

With reference to the first aspect, in a first implementation manner of the first aspect, the method further includes directly outputting a level signal after the logical operation from the source electrode of the first field effect transistor switch.

With reference to the first aspect or the first implementation manner of the first aspect, in a second implementation manner of the first aspect, the logical operation unit further includes a read amplifier, where the read amplifier is connected to the third resistive random access memory; and the outputting a level signal that is stored in the third resistive random access memory after the logical operation includes outputting, from the read amplifier, the level signal that is stored in the third resistive random access memory after the logical operation.

With reference to the first aspect or the first implementation manner of the first aspect, in a third implementation manner of the first aspect, the input end of the third resistive random access memory is a negative electrode, and an output end of the third resistive random access memory is a positive electrode; the input ends of the first resistive random access memory and the second resistive random access memory are negative electrodes; and the output ends of the first resistive random access memory and the second resistive random access memory are positive electrodes; and the logical operation is an AND logical operation.

With reference to the first aspect or the first implementation manner of the first aspect, in a fourth implementation manner of the first aspect, the input end of the third resistive random access memory is a negative electrode, and an output end of the third resistive random access memory is a positive electrode; the input ends of the first resistive random access memory and the second resistive random access memory are positive electrodes; and the output ends of the first resistive random access memory and the second resistive random access memory are negative electrodes; and the logical operation is an OR logical operation.

According to a second aspect, an embodiment of the present disclosure provides an apparatus for operating a logical operation array of a resistive random access memory, including an input control module configured to turn on a first field effect transistor switch of at least one logical operation unit in the logical operation array, turn off a second field effect transistor switch of the logical operation unit, and set a third resistive random access memory of the logical operation unit to a storage bit write voltage; and separately input a level signal to input ends of a first resistive random access memory and a second resistive random access memory of the logical operation unit; where the logical operation array includes at least one logical operation unit, where each logical operation unit includes the first resistive random access memory, the second resistive random access memory, the third resistive random access memory, the first field effect transistor switch, the second field effect transistor switch, and a voltage converter; where an input end of the first resistive random access memory serves as a first bit line input end; an input end of the second resistive random access memory serves as a second bit line input end; and an output end of the first resistive random access memory is connected to an output end of the second resistive random access memory, and is connected to an input end of the voltage converter; a gate electrode input end of the first field effect transistor switch serves as a first word line input end; a gate electrode input end of the second field effect transistor switch serves as a second word line input end; an output end of the voltage converter is connected to a drain electrode of the first field effect transistor switch, and a source electrode of the first field effect transistor switch is connected to an input end of the third resistive random access memory; and the input end of the third resistive random access memory is further connected to a drain electrode of the second field effect transistor switch, and a source electrode of the second field effect transistor switch is grounded; and an output control module configured to, after a logical operation, turn off the first field effect transistor switch, turn on the second field effect transistor switch, set the third resistive random access memory to a read voltage, and output a level signal that is stored in the third resistive random access memory after the logical operation.

With reference to the second aspect, in a first implementation manner of the second aspect, the output control module is further configured to directly output a level signal after the logical operation from the source electrode of the first field effect transistor switch.

With reference to the second aspect or the first implementation manner of the second aspect, in a second implementation manner of the second aspect, the logical operation unit further includes a read amplifier, where the read amplifier is connected to the third resistive random access memory; and the output control module is configured to output, from the read amplifier, the level signal that is stored in the third resistive random access memory after the logical operation.

With reference to the second aspect or the first implementation manner of the second aspect, in a third implementation manner of the second aspect, the input end of the third resistive random access memory is a negative electrode, and an output end of the third resistive random access memory is a positive electrode; the input ends of the first resistive random access memory and the second resistive random access memory are negative electrodes; and the output ends of the first resistive random access memory and the second resistive random access memory are positive electrodes; and the logical operation is an AND logical operation.

With reference to the second aspect or the first implementation manner of the second aspect, in a fourth implementation manner of the second aspect, the input end of the third resistive random access memory is a negative electrode, and an output end of the third resistive random access memory is a positive electrode; the input ends of the first resistive random access memory and the second resistive random access memory are positive electrodes; and the output ends of the first resistive random access memory and the second resistive random access memory are negative electrodes; and the logical operation is an OR logical operation.

According to a third aspect, an embodiment of the present disclosure provides a device for operating a logical operation array of a resistive random access memory, including the logical operation array, a processor, and a memory, where the logical operation array includes at least one logical operation unit, where each logical operation unit includes a first resistive random access memory, a second resistive random access memory, a third resistive random access memory, a first field effect transistor switch, a second field effect transistor switch, and a voltage converter; an input end of the first resistive random access memory serves as a first bit line input end; an input end of the second resistive random access memory serves as a second bit line input end; and an output end of the first resistive random access memory is connected to an output end of the second resistive random access memory, and is connected to an input end of the voltage converter; a gate electrode input end of the first field effect transistor switch serves as a first word line input end; a gate electrode input end of the second field effect transistor switch serves as a second word line input end; an output end of the voltage converter is connected to a drain electrode of the first field effect transistor switch, and a source electrode of the first field effect transistor switch is connected to an input end of the third resistive random access memory; the input end of the third resistive random access memory is further connected to a drain electrode of the second field effect transistor switch, and a source electrode of the second field effect transistor switch is grounded; and the memory stores an execution instruction; and when the device for operating a logical operation array of a resistive random access memory runs, the processor communicates with the logical operation array and the memory, and the processor executes the execution instruction so that the device for operating a logical operation array of a resistive random access memory executes the method according to the first aspect, or any one of the first to the fourth possible implementation manners of the first aspect.

According to the method, apparatus, and device for operating a logical operation array of a resistive random access memory in the embodiments of the present disclosure, a word line write control port of at least one logical operation unit in the logical operation array is controlled, and a third resistive random access memory of the logical operation unit is set to a storage bit write voltage; a level signal is separately input to input ends of a first resistive random access memory and a second resistive random access memory of the logical operation unit; and after a logical operation, a word line read control port is controlled, the third resistive random access memory is set to a read voltage, and a level signal that is stored in the third resistive random access memory after the logical operation is output, which implements a logical operation function and a storage function of a resistive random access memory, and resolves a problem in the prior art that the resistive random access memory is used only to perform an operation, and an operation result needs to be output to an external memory for storage.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show some embodiments of the present disclosure, and persons of ordinary skill in the art may still derive other drawings from these accompanying drawings without creative efforts.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. The described embodiments are some but not all of the embodiments of the present disclosure. All other embodiments obtained by persons of ordinary skill in the art based on the embodiments of the present disclosure without creative efforts shall fall within the protection scope of the present disclosure.

Figure 1:
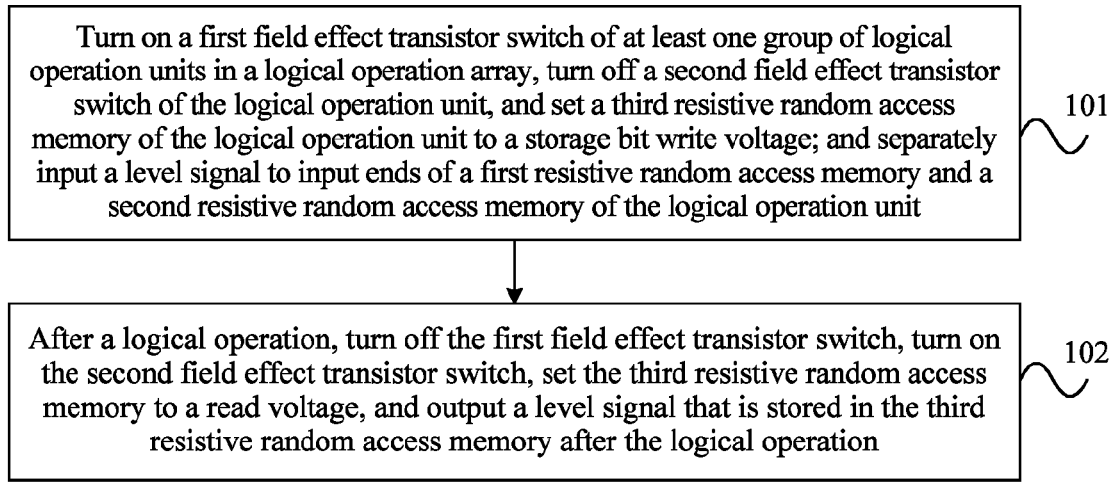
FIG. 1 is a flowchart of Embodiment 1 of a method for operating a logical operation array of a resistive random access memory according to the present disclosure.
Figure 2:
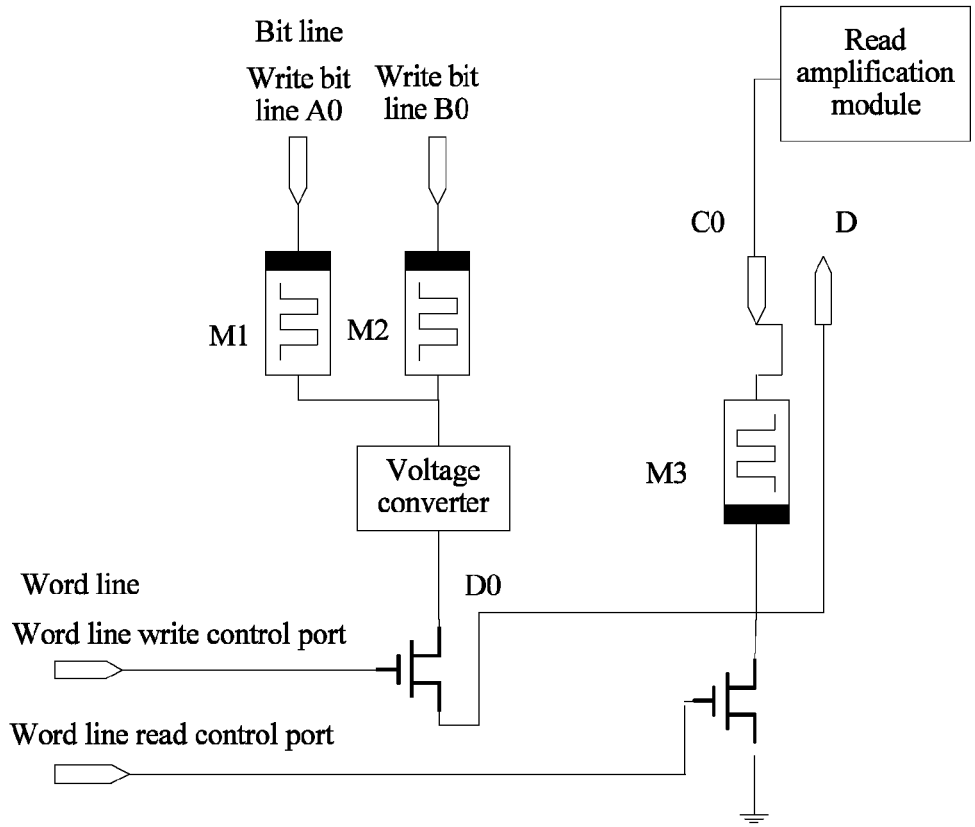
FIG. 2 is a schematic diagram of a logical operation unit of Embodiment 1 of a method according to the present disclosure.
Figure 3:
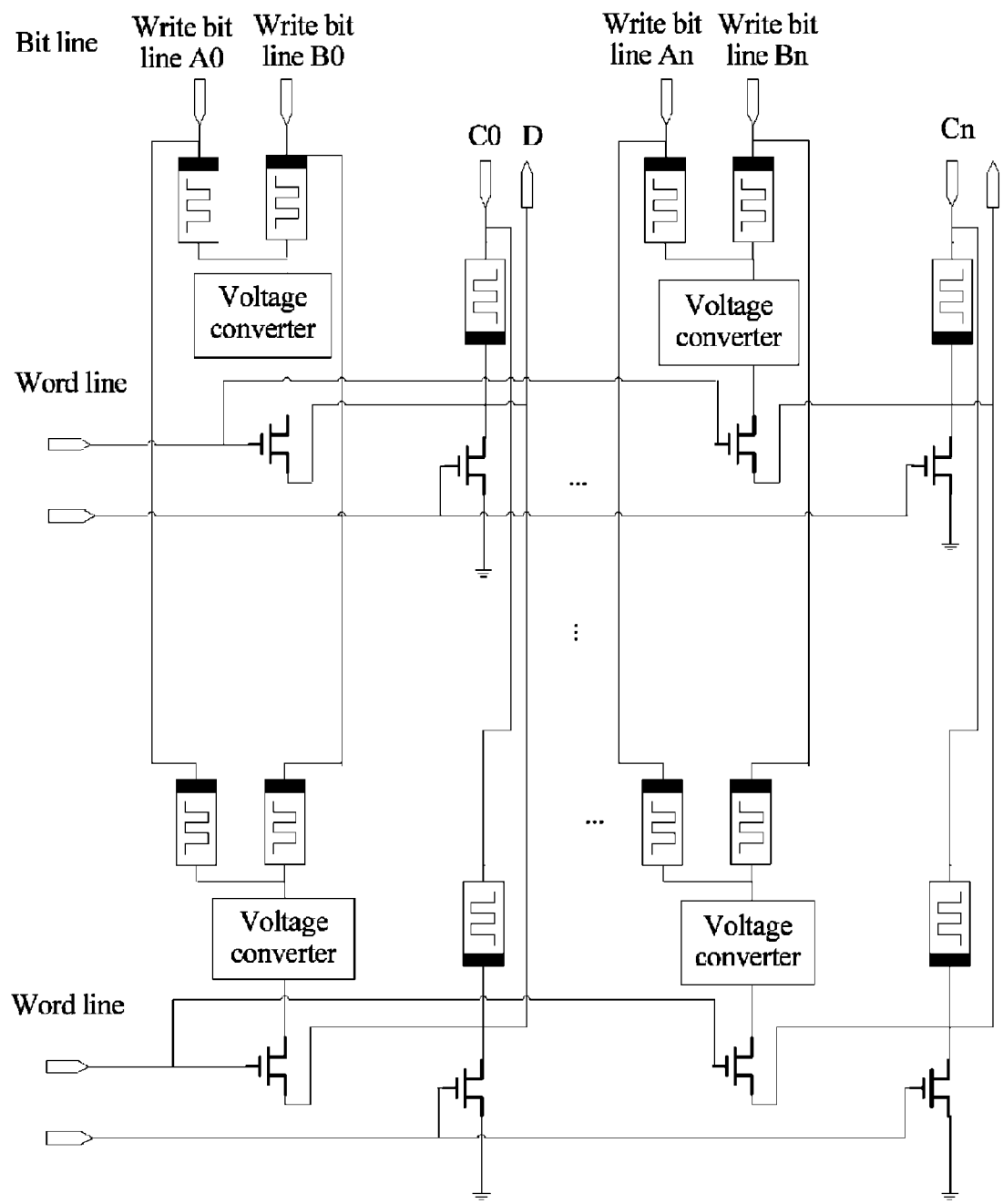
FIG. 3 is a schematic diagram of a logical operation array of Embodiment 1 of a method according to the present disclosure.

FIG. 1 is a flowchart of Embodiment 1 of a method for operating a logical operation array of a resistive random access memory according to the present disclosure. FIG. 2 is a schematic diagram of a logical operation unit of Embodiment 1 of a method according to the present disclosure. FIG. 3 is a schematic diagram of a logical operation array of Embodiment 1 of a method according to the present disclosure. This embodiment may be executed by an apparatus for operating a logical operation array of a resistive random access memory. As shown in FIG. 1 and FIG. 2, the method in this embodiment may include the following steps.

Step 101: Turn on a first field effect transistor switch of at least one logical operation unit in the logical operation array, turn off a second field effect transistor switch of the logical operation unit, and set a third resistive random access memory of the logical operation unit to a storage bit write voltage; and separately input a level signal to input ends of a first resistive random access memory and a second resistive random access memory of the logical operation unit.

The logical operation array includes at least one logical operation unit, where each logical operation unit includes the first resistive random access memory, the second resistive random access memory, the third resistive random access memory, the first field effect transistor switch, the second field effect transistor switch, and a voltage converter.

An input end of the first resistive random access memory serves as a first bit line input end; an input end of the second resistive random access memory serves as a second bit line input end; and an output end of the first resistive random access memory is connected to an output end of the second resistive random access memory, and is connected to an input end of the voltage converter.

A gate electrode input end of the first field effect transistor switch serves as a first word line input end.

A gate electrode input end of the second field effect transistor switch serves as a second word line input end.

An output end of the voltage converter is connected to a drain electrode of the first field effect transistor switch, and a source electrode of the first field effect transistor switch is connected to an input end of the third resistive random access memory.

The input end of the third resistive random access memory is further connected to a drain electrode of the second field effect transistor switch, and a source electrode of the second field effect transistor switch is grounded.

As shown in FIG. 2 and FIG. 3, the logical operation array includes multiple logical operation units, and each logical operation unit includes three resistive random access memories M1, M2, and M3, two of which implement a logical operation function (M1 and M2), and the other of which implements a storage function (M3); two switches, one of which is a write control switch of a word line, and the other of which is a read control switch of the word line; and corresponding ports that are classified into word lines and bit lines, where the word lines are respectively a word line write control port and a word line read control port, and the bit lines are respectively two write ports A0 and B0 of a logical operation, a bit line storage bit port C0, and a bit line direct output port D (optional). The voltage converter may serve purposes of voltage protection and isolation.

As shown in FIG. 2, the first field effect transistor switch of at least one logical operation unit in the logical operation array is turned on (that is, the write control switch of the word line is turned on), the second field effect transistor switch of the logical operation unit is turned off (that is, the read control switch of the word line is turned off), and the third resistive random access memory M3 of the logical operation unit is set to a storage bit write voltage; the level signal is separately input to input ends of the first resistive random access memory M1 and the second resistive random access memory M2 of the logical operation unit; and after the level signal passes through the first resistive random access memory M1 and the second resistive random access memory M2, a corresponding level signal is output, where the output level signal is stored in the third resistive random access memory M3 using the voltage converter, and may be directly output at the same time. In FIG. 2, an AND logical operation is used as an example. Changing polarities of the input ends and the output ends of the first resistive random access memory and the second resistive random access memory may change a type of a logical operation. In read and write operations, a third resistive random access memory corresponding to a word line that is not selected (that is, a write control switch and a read control switch of the word line are in a turned off state) may be set to an idle state.

Step 102: After a logical operation, turn off the first field effect transistor switch, turn on the second field effect transistor switch, set the third resistive random access memory to a read voltage, and output a level signal that is stored in the third resistive random access memory after a logical operation.

As shown in FIG. 2, after the logical operation, the first field effect transistor switch is turned off (that is, the write control switch of the word line is turned off), the second field effect transistor switch is turned on (that is, the read control switch of the word line is turned on), the third resistive random access memory M3 is set to a read voltage, and a level signal stored in the third resistive random access memory M3 after the logical operation is output.

Optionally, the method in this embodiment may further include, after the level signal is separately input to the input ends of the first resistive random access memory and the second resistive random access memory of the logical operation unit, directly outputting a level signal after the logical operation from the source electrode of the first field effect transistor switch.

As shown in FIG. 2 and FIG. 3, because in the logical operation, the first field effect transistor switch is turned on, the level signal after the logical operation is output from the source electrode of the first field effect transistor switch via the bit line direct output port D.

Optionally, the logical operation unit further includes a read amplifier, where the read amplifier is connected to the third resistive random access memory.

The outputting a level signal that is stored in the third resistive random access memory after the logical operation includes outputting, from the read amplifier, the level signal that is stored in the third resistive random access memory after the logical operation.

As shown in FIG. 2, the logical operation unit may further include the read amplifier, which is connected to an output end of the third resistive random access memory M3. The level signal that is stored in the third resistive random access memory after the logical operation may be output via the read amplifier, that is, when a level signal that is output by the output end of the third resistive random access memory M3 does not match an externally identifiable level signal, amplification is performed; if the output level signal is a high electrical level 1 volt (V), but an external high level signal is at least 5 V, the output level signal is amplified.

In this embodiment, a word line write control port of at least one logical operation unit in a logical operation array is controlled, and a third resistive random access memory of the logical operation unit is set to a storage bit write voltage; a level signal is separately input to input ends of a first resistive random access memory and a second resistive random access memory of the logical operation unit; and after the logical operation, a word line read control port is controlled, the third resistive random access memory is set to a read voltage, and a level signal that is stored in the third resistive random access memory after the logical operation is output, which implements a logical operation function and a storage function of a resistive random access memory, and resolves a problem in the prior art that the resistive random access memory is used only to perform an operation, and an operation result needs to be output to an external memory for storage.

Figure 4:
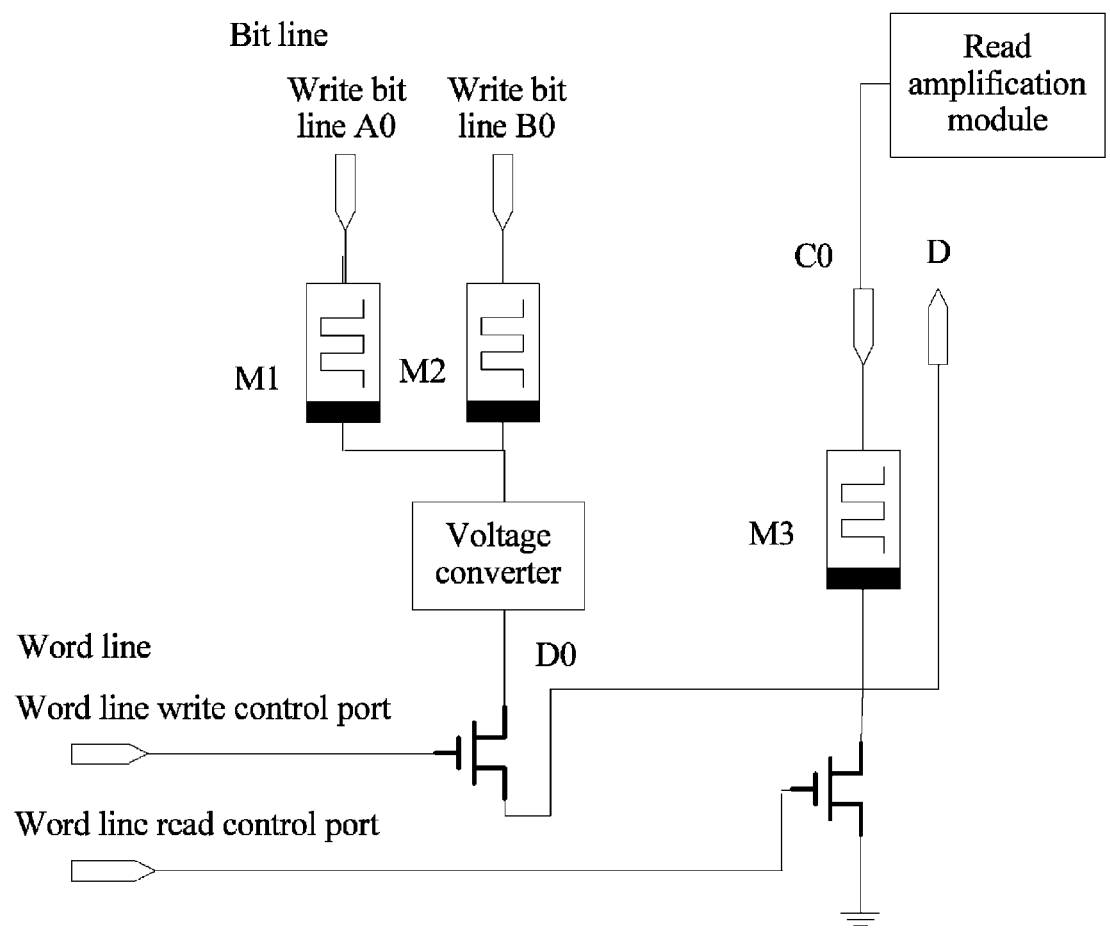
FIG. 4 is a schematic diagram of a logical operation unit of Embodiment 2 of a method for operating a logical operation array of a resistive random access memory according to the present disclosure.
Figure 5:
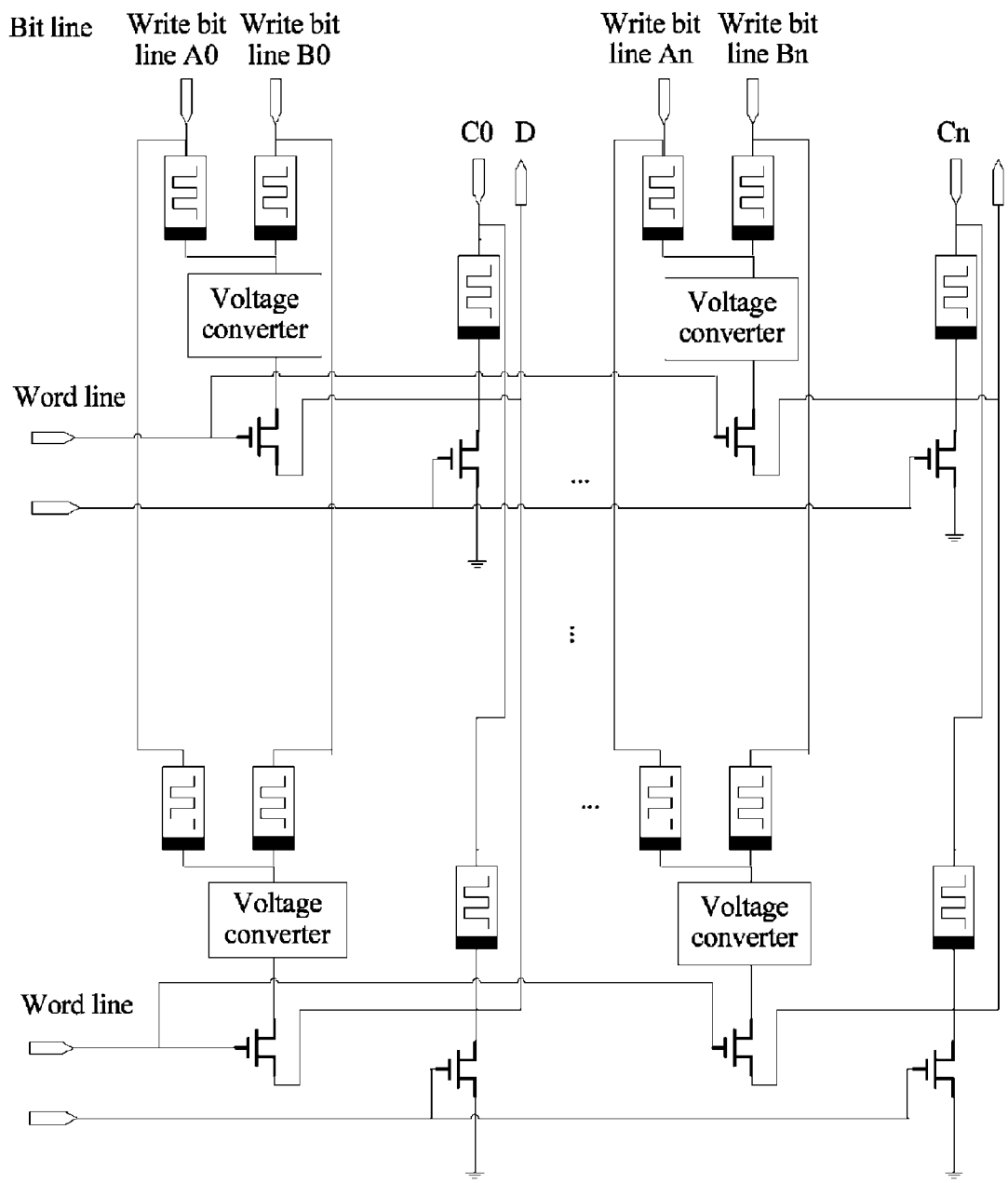
FIG. 5 is a schematic diagram of a logical operation array of Embodiment 2 of a method according to the present disclosure.

FIG. 4 is a schematic diagram of a logical operation unit of Embodiment 2 of a method for operating a logical operation array of a resistive random access memory according to the present disclosure. FIG. 5 is a schematic diagram of a logical operation array of Embodiment 2 of a method according to the present disclosure. On the basis of the method of Embodiment 1, further, in the method of this embodiment, the input end of the third resistive random access memory is a negative electrode, and an output end of the third resistive random access memory is a positive electrode.

The input ends of the first resistive random access memory and the second resistive random access memory are negative electrodes; and the output ends of the first resistive random access memory and the second resistive random access memory are positive electrodes.

A logical operation performed using the logical operation array is an AND logical operation.

As shown in FIG. 2, the AND logical operation is implemented as follows: it is assumed that a high electrical level is 5 V, a low electrical level is 0 V, a SET voltage of the resistive random access memory is less than or equal to 2.5 V, and a RESET voltage is greater than or equal to −2.5 V. In the case of writing, a write voltage of a storage bit is always 2.5 V, and a voltage of an output point D0 is:

1. when inputs A0 and B0 are both high electrical levels, D0 is a high electrical level, a voltage drop at both ends of M3 is −2.5 V, and M3 RESET is in a high resistance state; in this case, M3 stores "1" and outputs a high electrical level;

2. when inputs A0 and B0 are both low electrical levels, D0 is a low electrical level, a voltage drop at both ends of M3 is 2.5 V, and M3 SET is in a low resistance state; in this case, M3 stores "0" and outputs a low electrical level;

3. when input A0 is a high electrical level and input B0 is a low electrical level, D0 is a low electrical level, a voltage drop at both ends of M3 is 2.5 V, and M3 SET is in a low resistance state; in this case, M3 stores "0" and outputs a low electrical level; or 4. when input A0 is a low electrical level and input B0 is a high electrical level, D0 is a low electrical level, a voltage drop at both ends of M3 is 2.5 V, and M3 SET is in a low resistance state; in this case, M3 stores "0" and outputs a low electrical level.

TABLE 1

Truth table for an AND logical operation

| Input | | Output |
|---|---|---|
| A0 | B0 | D0 |
| 0 | 0 | 0 |
| 0 | 1 | 0 |
| 1 | 0 | 0 |
| 1 | 1 | 1 |

Optionally, the input end of the third resistive random access memory is a negative electrode, and an output end of the third resistive random access memory is a positive electrode.

The input ends of the first resistive random access memory and the second resistive random access memory are positive electrodes; and the output ends of the first resistive random access memory and the second resistive random access memory are negative electrodes.

A logical operation performed using the logical operation array is an OR logical operation.

As shown in FIG. 4 and FIG. 5, the OR logical operation is implemented as follows: polarities of M1 and M2 are set to polarities opposite to those in FIG. 2, that is, an OR gate.

It is assumed that a high electrical level is 5 V, a low electrical level is 0 V, a SET voltage of the resistive random access memory is less than or equal to 2.5 V, and a RESET voltage is greater than or equal to −2.5 V. In the case of writing, a write voltage of a storage bit is always 2.5 V, and a voltage of an output point D0 is:

1. when inputs A0 and B0 are both high electrical levels, D0 is a high electrical level, a voltage drop at both ends of M3 is −2.5 V, and M3 RESET is in a high resistance state; in this case, M3 stores "1" and outputs a high electrical level;

2. when inputs A0 and B0 are both low electrical levels, D0 is a low electrical level, a voltage drop at both ends of M3 is 2.5 V, and M3 SET is in a low resistance state; in this case, M3 stores "0" and outputs a low electrical level;

3. when input A0 is a high electrical level and input B0 is a low electrical level, D0 is a high electrical level, a voltage drop at both ends of M3 is −2.5 V, and M3 RESET is in a high resistance state; in this case, M3 stores "1" and outputs a high electrical level; or 4. when input A0 is a low electrical level and input B0 is a high electrical level, D0 is a high electrical level, a voltage drop at both ends of M3 is −2.5 V, and M3 RESET is in a high resistance state; in this case, M3 stores "1" and outputs a high electrical level.

TABLE 2

Truth table for an OR logical operation

| Input | | Output |
|---|---|---|
| A0 | B0 | D0 |
| 0 | 0 | 0 |
| 0 | 1 | 1 |
| 1 | 0 | 1 |
| 1 | 1 | 1 |

In this embodiment, a word line write control port of at least one logical operation unit in a logical operation array is controlled, and a third resistive random access memory of the logical operation unit is set to a storage bit write voltage; a level signal is separately input to input ends of a first resistive random access memory and a second resistive random access memory of the logical operation unit; and after the logical operation, a word line read control port is controlled, the third resistive random access memory is set to a read voltage, and a level signal that is stored in the third resistive random access memory after the logical operation is output, which implements a logical operation function and a storage function of a resistive random access memory, may implement an AND logical operation and an OR logical operation by changing positive and negative electrodes of the input ends and output ends of the first resistive random access memory and the second resistive random access memory, and resolves a problem in the prior art that the resistive random access memory is used only to perform an operation, and an operation result needs to be output to an external memory for storage.

Figure 6:
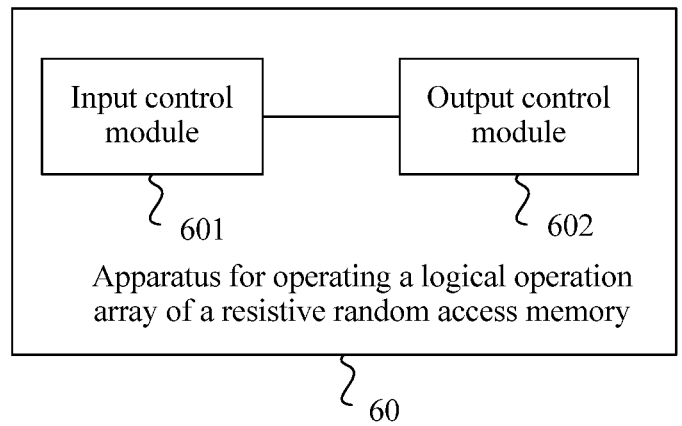
FIG. 6 is a schematic structural diagram of Embodiment 1 of an apparatus for operating a logical operation array of a resistive random access memory according to the present disclosure.

FIG. 6 is a schematic structural diagram of Embodiment 1 of an apparatus for operating a logical operation array of a resistive random access memory according to the present disclosure. As shown in FIG. 6, the apparatus 60 in this embodiment may include an input control module 601 and an output control module 602, where the input control module 601 is configured to turn on a first field effect transistor switch of at least one logical operation unit in the logical operation array, turn off a second field effect transistor switch of the logical operation unit, and set a third resistive random access memory of the logical operation unit to a storage bit write voltage; and separately input a level signal to input ends of a first resistive random access memory and a second resistive random access memory of the logical operation unit.

The logical operation array includes at least one logical operation unit, where each logical operation unit includes the first resistive random access memory, the second resistive random access memory, the third resistive random access memory, the first field effect transistor switch, the second field effect transistor switch, and a voltage converter.

An input end of the first resistive random access memory serves as a first bit line input end; an input end of the second resistive random access memory serves as a second bit line input end; and an output end of the first resistive random access memory is connected to an output end of the second resistive random access memory, and is connected to an input end of the voltage converter.

A gate electrode input end of the first field effect transistor switch serves as a first word line input end.

A gate electrode input end of the second field effect transistor switch serves as a second word line input end.

An output end of the voltage converter is connected to a drain electrode of the first field effect transistor switch, and a source electrode of the first field effect transistor switch is connected to an input end of the third resistive random access memory.

The input end of the third resistive random access memory is further connected to a drain electrode of the second field effect transistor switch, and a source electrode of the second field effect transistor switch is grounded.

The output control module 602 is configured to, after the logical operation, turn off the first field effect transistor switch, turn on the second field effect transistor switch, set the third resistive random access memory to a read voltage, and output a level signal that is stored in the third resistive random access memory after the logical operation.

Optionally, the output control module 602 is further configured to directly output a level signal after the logical operation from the source electrode of the first field effect transistor switch.

Optionally, the logical operation unit further includes a read amplifier, where the read amplifier is connected to the third resistive random access memory.

The output control module 602 is configured to output, from the read amplifier, the level signal that is stored in the third resistive random access memory after the logical operation.

Optionally, the input end of the third resistive random access memory is a negative electrode, and an output end of the third resistive random access memory is a positive electrode.

The input ends of the first resistive random access memory and the second resistive random access memory are negative electrodes; and the output ends of the first resistive random access memory and the second resistive random access memory are positive electrodes.

The logical operation is an AND logical operation.

Optionally, the input end of the third resistive random access memory is a negative electrode, and an output end of the third resistive random access memory is a positive electrode.

The input ends of the first resistive random access memory and the second resistive random access memory are positive electrodes; and the output ends of the first resistive random access memory and the second resistive random access memory are negative electrodes.

The logical operation is an OR logical operation.

The apparatus in this embodiment may be configured to implement the technical solution in method embodiments 1 and 2, and implementation principles and technical effects of the apparatus are similar and details are not described herein.

Figure 7:
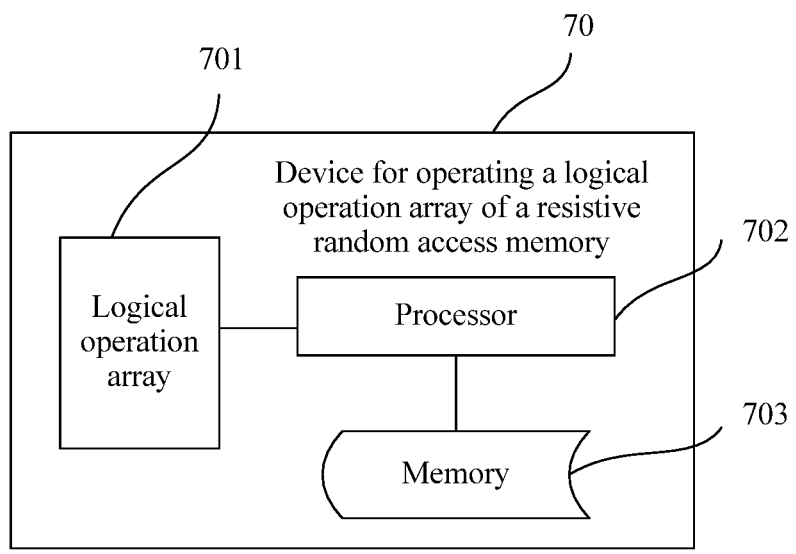
FIG. 7 is a schematic structural diagram of Embodiment 1 of a device for operating a logical operation array of a resistive random access memory according to the present disclosure.

FIG. 7 is a schematic structural diagram of Embodiment 1 of a device for operating a logical operation array of a resistive random access memory according to the present disclosure. As shown in FIG. 7, a device 70 for operating a logical operation array of a resistive random access memory provided in this embodiment includes a logical operation array 701, a processor 702, and a memory 703, where the logical operation array 701 includes at least one logical operation unit, where each logical operation unit includes a first resistive random access memory, a second resistive random access memory, a third resistive random access memory, a first field effect transistor switch, a second field effect transistor switch, and a voltage converter.

An input end of the first resistive random access memory serves as a first bit line input end; an input end of the second resistive random access memory serves as a second bit line input end; and an output end of the first resistive random access memory is connected to an output end of the second resistive random access memory, and is connected to an input end of the voltage converter.

A gate electrode input end of the first field effect transistor switch serves as a first word line input end.

A gate electrode input end of the second field effect transistor switch serves as a second word line input end.

An output end of the voltage converter is connected to a drain electrode of the first field effect transistor switch, and a source electrode of the first field effect transistor switch is connected to an input end of the third resistive random access memory.

The input end of the third resistive random access memory is further connected to a drain electrode of the second field effect transistor switch, and a source electrode of the second field effect transistor switch is grounded.

The memory 703 stores an execution instruction; when the device 70 for operating a logical operation array of a resistive random access memory runs, the processor 702 communicates with the logical operation array 701 and the memory 703, and the processor 702 invokes the execution instruction in the memory 703, to execute the technical solution in either of method embodiments 1 and 2, and implementation principles and technical effects are similar and details are not described herein.

In the several embodiments provided in the present application, it should be understood that the disclosed device and method may be implemented in other manners. For example, the described device embodiment is merely exemplary. For example, the unit or module division is merely logical function division and may be other division in actual implementation. For example, a plurality of units or modules may be combined or integrated into another system, or some features may be ignored or not performed. In addition, the displayed or discussed mutual couplings or direct couplings or communication connections may be implemented using some interfaces. The indirect couplings or communication connections between the devices or modules may be implemented in electronic, mechanical, or other forms.

The modules described as separate parts may or may not be physically separate, and parts displayed as modules may or may not be physical modules, may be located in one position, or may be distributed on a plurality of network units. Some or all of the modules may be selected according to actual requirements to achieve the objectives of the solutions of the embodiments.

Persons of ordinary skill in the art may understand that all or some of the steps of the method embodiments may be implemented by a program instructing relevant hardware. The program may be stored in a computer-readable storage medium. When the program runs, the steps of the method embodiments are performed. The foregoing storage medium includes any medium that can store program code, such as a read-only memory (ROM), a random access memory (RAM), a magnetic disk, or an optical disc.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A method for operating a logical operation array of a resistive random access memory, comprising:
   turning on a first field effect transistor switch of at least one logical operation unit in the logical operation array;
   turning off a second field effect transistor switch of the logical operation unit;
   setting a third resistive random access memory of the logical operation unit to a storage bit write voltage; and
   separately inputting a level signal to input ends of a first resistive random access memory and a second resistive random access memory of the logical operation unit,
   wherein the logical operation array comprises at least one logical operation unit, wherein each logical operation unit comprises the first resistive random access memory, the second resistive random access memory, the third resistive random access memory, the first field effect transistor switch, the second field effect transistor switch, and a voltage converter,
   wherein an input end of the first resistive random access memory serves as a first bit line input end,
   wherein an input end of the second resistive random access memory serves as a second bit line input end,
   wherein an output end of the first resistive random access memory is connected to an output end of the second resistive random access memory, and is connected to an input end of the voltage converter,
   wherein a gate electrode input end of the first field effect transistor switch serves as a first word line input end,
   wherein a gate electrode input end of the second field effect transistor switch serves as a second word line input end, wherein an output end of the voltage converter is connected to a drain electrode of the first field effect transistor switch, wherein a source electrode of the first field effect transistor switch is connected to an input end of the third resistive random access memory, wherein the input end of the third resistive random access memory is further connected to a drain electrode of the second field effect transistor switch, wherein a source electrode of the second field effect transistor switch is grounded, and wherein after a logical operation, turning off the first field effect transistor switch, turning on the second field effect transistor switch, setting the third resistive random access memory to a read voltage, and outputting a level signal that is stored in the third resistive random access memory after the logical operation.

2. The method according to claim 1, further comprising directly outputting the level signal after the logical operation from the source electrode of the first field effect transistor switch to the input end of the third resistive random access memory.

3. The method according to claim 1, wherein the logical operation unit further comprises a read amplifier, wherein the read amplifier is connected to the third resistive random access memory; and wherein outputting the level signal that is stored in the third resistive random access memory after the logical operation comprises outputting, from the read amplifier, the level signal that is stored in the third resistive random access memory after the logical operation.

4. The method according to claim 1, wherein the input end of the third resistive random access memory is a negative electrode, wherein an output end of the third resistive random access memory is a positive electrode, wherein the input ends of the first resistive random access memory and the second resistive random access memory are negative electrodes, wherein the output ends of the first resistive random access memory and the second resistive random access memory are positive electrodes, and wherein the logical operation is an AND logical operation.

5. The method according to claim 1, wherein the input end of the third resistive random access memory is a negative electrode, wherein an output end of the third resistive random access memory is a positive electrode, wherein the input ends of the first resistive random access memory and the second resistive random access memory are positive electrodes, wherein the output ends of the first resistive random access memory and the second resistive random access memory are negative electrodes, and wherein the logical operation is an OR logical operation.

6. A logical operation array of a resistive random access memory, comprising:

at least one logical operation unit, wherein each logical operation unit comprises:
a first resistive random access memory;
a second resistive random access memory;
a third resistive random access memory;
a first field effect transistor switch;
a second field effect transistor switch; and
a voltage converter, wherein a first field effect transistor switch of at least one logical operation unit in the logical operation array is turned on, a second field effect transistor switch of the logical operation unit is turned off, and a third resistive random access memory of the logical operation unit is set to a storage bit write voltage, wherein input ends of a first resistive random access memory and a second resistive random access memory of the logical operation unit receives a level signal, wherein an input end of the first resistive random access memory serves as a first bit line input end, wherein an input end of the second resistive random access memory serves as a second bit line input end, wherein an output end of the first resistive random access memory is connected to an output end of the second resistive random access memory, and is connected to an input end of the voltage converter, wherein a gate electrode input end of the first field effect transistor switch serves as a first word line input end, wherein a gate electrode input end of the second field effect transistor switch serves as a second word line input end, wherein an output end of the voltage converter is connected to a drain electrode of the first field effect transistor switch, and a source electrode of the first field effect transistor switch is connected to an input end of the third resistive random access memory, wherein the input end of the third resistive random access memory is further connected to a drain electrode of the second field effect transistor switch, and a source electrode of the second field effect transistor switch is grounded, and wherein after a logical operation, the first field effect transistor switch is turned off, the second field effect transistor switch is turned on, the third resistive random access memory is set to a read voltage, and the third resistive random access memory stores a level signal for outputting after the logical operation.

7. The logical operation array according to claim 6, wherein the source electrode of the first field effect transistor switch outputs the level signal after the logical operation to the input end of the third resistive random access memory.

8. The logical operation array according to claim 6, wherein the logical operation unit further comprises a read amplifier connected to the third resistive random access memory, and wherein the read amplifier outputs the level signal that is stored in the third resistive random access memory after the logical operation.

9. The logical operation array according to claim 6, wherein the input end of the third resistive random access memory is a negative electrode, and wherein an output end of the third resistive random access memory is a positive electrode, wherein the input ends of the first resistive random access memory and the second resistive random access memory are negative electrodes, wherein the output ends of the first resistive random access memory and the second resistive random access memory are positive electrodes, and wherein the logical operation is an AND logical operation.

10. The logical operation array according to claim 6, wherein the input end of the third resistive random access memory is a negative electrode, wherein an output end of the third resistive random access memory is a positive electrode, wherein the input ends of the first resistive random access memory and the second resistive random access memory are positive electrodes, wherein the output ends of the first resistive random access memory and the second resistive random access memory are negative electrodes, and wherein the logical operation is an OR logical operation.

11. A device for operating a logical operation array of a resistive random access memory, comprising:
- a memory configured to store an execution instruction; and
- a processor coupled to the logical operation array and the memory, wherein the processor is configured to execute the execution instruction stored in the memory;
- wherein the logical operation array comprises at least one logical operation unit, wherein each logical operation unit comprises:
  - a first resistive random access memory;
  - a second resistive random access memory;
  - a third resistive random access memory;
  - a first field effect transistor switch, a second field effect transistor switch; and
  - a voltage converter;
- wherein an input end of the first resistive random access memory serves as a first bit line input end,
- wherein an input end of the second resistive random access memory serves as a second bit line input end,
- wherein an output end of the first resistive random access memory is connected to an output end of the second resistive random access memory, and is connected to an input end of the voltage converter,
- wherein a gate electrode input end of the first field effect transistor switch serves as a first word line input end,
- wherein a gate electrode input end of the second field effect transistor switch serves as a second word line input end,
- wherein an output end of the voltage converter is connected to a drain electrode of the first field effect transistor switch, and a source electrode of the first field effect transistor switch is connected to an input end of the third resistive random access memory,
- wherein the input end of the third resistive random access memory is further connected to a drain electrode of the second field effect transistor switch, and a source electrode of the second field effect transistor switch is grounded,
- wherein the logical operation array performs logical operation based on the execution instruction from the processor, and
- wherein the processor obtains level signal output by the logical operation array after the logical operation.

* * * * *